(12) United States Patent
Koh

(10) Patent No.: US 8,174,594 B2
(45) Date of Patent: May 8, 2012

(54) METHOD OF OPERATING RIPPLE COUNTER, IMAGE SENSOR HAVING RIPPLE COUNTER, METHOD OF OPERATING IMAGE SENSOR, AND ANALOG-TO-DIGITAL CONVERTER OF IMAGE SENSOR

(75) Inventor: Kyoung Min Koh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 625 days.

(21) Appl. No.: 12/222,150

(22) Filed: Aug. 4, 2008

(65) Prior Publication Data

US 2009/0060118 A1    Mar. 5, 2009

(30) Foreign Application Priority Data

Aug. 29, 2007    (KR) .................. 10-2007-0086980

(51) Int. Cl.
*H04N 3/14* (2006.01)
*H04N 5/335* (2006.01)
(52) U.S. Cl. ....................... 348/294; 348/308
(58) Field of Classification Search .................. 348/294, 348/308; 341/164, 155; 377/33, 45
See application file for complete search history.

(56) References Cited

U.S. PATENT DOCUMENTS

| | | | | |
|---|---|---|---|---|
| 5,877,715 A * | 3/1999 | Gowda et al. | ................. | 341/122 |
| 5,920,274 A * | 7/1999 | Gowda et al. | ................. | 341/155 |
| 6,567,340 B1 * | 5/2003 | Nataraj et al. | ................. | 365/236 |
| 7,292,177 B2 * | 11/2007 | Muramatsu et al. | .......... | 341/164 |
| 7,495,597 B2 * | 2/2009 | Muramatsu et al. | .......... | 341/164 |
| 7,629,914 B2 * | 12/2009 | Muramatsu et al. | .......... | 341/164 |
| 2006/0012696 A1 * | 1/2006 | Zarnowski et al. | ........... | 348/294 |
| 2008/0019472 A1 * | 1/2008 | Muramatsu et al. | ............ | 377/45 |

FOREIGN PATENT DOCUMENTS

| | | |
|---|---|---|
| CN | 1697323 | 11/2005 |
| JP | 6-236345 | 8/1994 |
| JP | 2006-33452 | 2/2006 |
| KR | 1020060045620 | 5/2006 |

OTHER PUBLICATIONS

Chinese Office Action dated Jul. 28, 2011 for Chinese Appl. No. 20081021424.5.

* cited by examiner

*Primary Examiner* — James Hannett

(74) *Attorney, Agent, or Firm* — Harness, Dickey & Pierce, P.L.C.

(57) ABSTRACT

An example embodiment of an image sensor may include a controller and a plurality of up/down ripple counters. The controller may generate a first control signal and a second control signal. Each of the up/down ripple counters may perform a stop operation or a count operation in response to a corresponding one of a plurality of operation control signals generated based on at least in part on the first control signal. The count operation may be an up-count operation or a down-count operation based on the second control signal. The image sensor may also include a plurality of memory chains. Each of the memory chains may receive a count value output from the up/down counters and may shift the received count value in response to a third control signal and a fourth control signal output from the controller.

12 Claims, 8 Drawing Sheets

METHOD OF OPERATING RIPPLE COUNTER, IMAGE SENSOR HAVING RIPPLE COUNTER, METHOD OF OPERATING IMAGE SENSOR, AND ANALOG-TO-DIGITAL CONVERTER OF IMAGE SENSOR

PRIORITY STATEMENT

This application claims the benefit of Korean Patent Application No. 10-2008-0086980, filed on Aug. 29, 2007, in the Korean Intellectual Property Office, the disclosure of which is incorporated herein in its entirety by reference.

BACKGROUND

1. Field of the Invention

Example embodiments relate to an image sensing technology, and more particularly, to a CMOS image sensor having an up/down ripple counter which may prevent the change of data during a count operation. Example embodiments also relate to a method of operating a CMOS image sensor. Also, example embodiments relate to a CMOS image sensor which may allow a reduction in size of an analog-to-digital conversion circuit included in a CMOS image sensor and increase operation speed of the CMOS image sensor.

2. Description of Related Art

Image sensors of semiconductor devices generally convert an optical image to an electric signal. A charge coupled device (CCD) using coupling of charges and a CMOS image sensor (CIS) are widely used as image sensors. In general, the CIS is widely used in a variety of fields because generally a low voltage operation is possible and less power is consumed compared to the CCD. Also, the CIS using a standard CMOS process is considered by some to be advantageous for integration and may replace the CCD in many fields in the future.

The CIS requires an operation of converting an analog signal output from an active pixel sensor (APS) array to a digital signal, unlike the CCD. Thus, for the conversion, the CIS uses an analog-to-digital converter (ADC).

For example, a CIS may include a single ADC type and/or a column ADC type according to a conventional analog-to-digital conversion method. The single ADC type is to convert analog pixel signals output from all columns to digital signals within a desired and/or predetermined time period by using a single ADC that operates at high speed. The single ADC may have the merit of reducing the size of a chip where the ADC is embodied. However, since the single ADC is generally operated at high speed, power consumption is generally high.

In a column ADC type, an ADC having a simple structure is arranged for each column. Accordingly, the power consumption is generally smaller than that of the single ADC type. However, the size of a chip where the ADC is embodied increases as the number of columns of the APS array increases.

FIG. 1 is a block diagram schematically illustrating a conventional CMOS image sensor. Referring to FIG. 1, a CMOS image sensor 1 includes a timing controller 3, a row driver 5, an APS array 7, a reference voltage generator 9, and a plurality of ADCs 11-1, 11-2, 11-3, ..., 11-n, where "n" is a natural number. Control logic generates a plurality of control signals (DIR, CLK, TX1, and TX2).

Each of the ADCs includes a comparator, an up/down ripple counter and a memory device. Referring to FIG. 1, ADC 11-1 includes comparator 13-1, up/down ripple counter 15-1 and memory device 17-1; ADC 11-2 includes comparator 13-2, up/down ripple counter 15-2 and memory device 17-2; ADC 11-3 includes comparator 13-3, up/down ripple counter 15-3 and memory device 17-3; ...; and ADC 11-n includes comparator 13-n, up/down ripple counter 15-n and memory device 17-n.

Each of the comparators 13-1, 13-2, 13-3, ..., 13-n receives and compares a pixel signal output through each column of the APS array 7 and a ramp signal Vramp output from the reference voltage generator 9 and outputs a result of the comparison.

Each of the up/down ripple counters 15-1, 15-2, 15-3, ..., 15-n counts a state transition time of a comparison signal output from each of the comparators 13-1, 13-2, 13-3, ..., 13-n based on a clock signal CLK. Each of the up/down ripple counters 15-1, 15-2, 15-3, ..., 15-n operates as either an up-counter or a down-counter. Whether the up/down ripple counter operates as an up-counter or a down counter may be determined based on a direction signal DIR, which may be output from the control logic. In the up/down ripple counters 15-1, 15-2, 15-3, ..., 15-n, a problem is that output values (e.g., count values) of the up/down ripple counters 15-1, 15-2, 15-3, ..., 15-n change at the moment when a count operation is switched to a stop operation or vice versa.

The memory devices 17-1, 17-2, 17-3, ..., 17-n receive and store the count value output from the up/down ripple counters 15-1, 15-2, 15-3, ..., 15-n, respectively. The memory devices 17-1, 17-2, 17-3, ..., 17-n may receive and store the count values in response to a first transmission control signal TX1 provided by the control logic and may output the stored count values through a sensor amplifier 19 via data bus DBUS in response to a second transmission control signal TX2 provided by the control logic.

Each of the up/down ripple counters 15-1, 15-2, 15-3, ..., 15-n and each of the memory devices 17-1, 17-2, 17-3, ..., 17-n is embodied by a plurality of flip-flops. For example, each of the up/down ripple counters 15-1, 15-2, 15-3, ..., 15-n and each of the memory devices 17-1, 17-2, 17-3, ..., 17-n include as many flip-flops as the number of data bits for converting pixel signals to digital signals. Also, as the resolution of the APS array 7 increases, the number of columns of the APS array 7 increases. Thus, the size of an area occupied by the ADCs increases as the APS array 7 increases. Similarly, the size of an area occupied by the up/down ripple counters 15-1, 15-2, 15-3, ..., 15-n and the memory devices 17-1, 17-2, 17-3, ..., 17-n is increased as the APS array 7 increases.

Still referring to FIG. 1, the memory devices 17-1, 17-2, 17-3, ..., 17-n respectively output the count value output from the up/down ripple counters 15-1, 15-2, 15-3, ..., 15-n to the sensor amplifier 19 via the DBUS. The sensor amplifier 19 detects and amplifies a received count value and outputs a result of the amplification.

As shown in FIG. 1, each of the memory devices 17-1, 17-2, 17-3, ..., 17-n respectively included in the ADCs 11-1, 11-2, 11-3, ..., 11-n outputs a count value using the DBUS. In view of the sensor amplifier 19, the DBUS receives a considerably large load. The transmission speed of the count value output from each of the memory devices 17-1, 17-2, 17-3, ..., 17-n decreases as the load increases. Therefore, a method to increase the speed of the data transmitted from each of the memory devices 17-1, 17-2, 17-3, ..., 17-n to the sensor amplifier 19 is needed.

SUMMARY

An example embodiment may reduce chip size of a CMOS image sensor by reducing the size of an ADC of a CMOS image sensor, and may provide a CMOS image sensor with a reduced chip size.

An example embodiment provides a method to prevent the change of the count values in up/down ripple counters at a switching moment when a count operation is switched to a stop operation or vice versa.

An example embodiment may reduce the layout area used and/or required for the up/down ripple counters and memory devices supporting an APS array of a CMOS image sensor.

An example embodiment may increase the data transmission speed associated with memory devices of a CMOS image sensor.

An example embodiment provides an image sensor. The image sensor may include a controller generating a first control signal and a second control signal, and a plurality of up/down ripple counters receiving a plurality of operation control signals. The plurality of operation control signals are based at least in part on the first control signal. Each of the plurality of up/down ripple counters perform a stop operation or a count operation in response to a corresponding one of plurality of operation control signals. The count operation may be an up-count operation or a down-count operation depending on the second control signal.

According to an example embodiment, the image sensor further includes a plurality of memory chains. Each of the plurality of memory chains receiving a count value output from each of the up/down ripple counters and shifting the received count value in response to a third control signal and a fourth control signal output from the controller.

According to an example embodiment, each of the up/down ripple counters may include a latch, and a switch block. The latch may have an input terminal, output terminal, complementary output terminal and clock terminal. The switch block connects the output terminal or the complementary output terminal of the latch to the input terminal of the latch in response to the corresponding one of the operation control signals; connects an output terminal or a complementary output terminal of a preceding latch to a clock terminal of the latch in response to the second control signal; and the output terminal or the complementary output terminal of the latch to a clock terminal of a next latch in response to the second control signals.

According to an example embodiment, each of the up/down ripple counters may include N number of latches, wherein N>2 and N is a natural number, and a switch block. The switching block may feed back an output signal or a complementary output signal of each of the N number of latches as an input signal of each of the N number of latches in response to a corresponding one of the operation control signals, and may connect an output terminal or a complementary output terminal of each of the N number of latches to a clock terminal of a next latch of each of the N number of latches in response to the second control signal.

According to an example embodiment, each of the up/down ripple counters may include a plurality of latches and a switch block. The switch block may connect each of output terminals of a first latch and each of input terminals of a second latch and each of output terminals of the second latch and each of input terminals of a third latch, or may cross-connecting each of the output terminals of the first latch and each of the input terminals of the second latch and each of the output terminals of the second latch and each of the input terminals of the third latch. Each of the latches may be an SR flip-flop.

According to an example embodiment, the second latch may include an edge triggered latch connected between the output terminal and the complementary output terminal of the second latch, and a level control circuit controlling a voltage level of each of the output terminals of the second latch based on a corresponding one of the operation control signals and signals input through the input terminals of the second latch.

According to an example embodiment, an image sensor may include a plurality of logic gate circuits. Each of the logic gates generating an operation control signal in response to the first control signal and an image signal output from a corresponding one of a plurality of pixels. Each of the logic gate circuits may be an OR gate circuit, for example.

According to an example embodiment, an image sensor may include a controller generating a first control signal and a second control signal, a plurality of comparison circuits, a plurality of operation control signal generation circuits, and a plurality of up/down ripple counters. Each of the comparison circuits may compare a reference signal and an image signal output from a corresponding one of a plurality of pixels. Each of the plurality of operation control signal generation circuits may generate an operation control signal in response to the first control signal and the comparison signal output from a corresponding comparison circuit. Each of the plurality of up/down ripple counters may perform a stop operation or a count operation in response to the operation control signal output from a corresponding operation control signal generation circuit. The count operation may be an up-count operation or a down-count operation depending on the second control signal.

According to an example embodiment, an image sensor may include a plurality of memory chains. Each of the plurality of memory chains receiving and shifting each of the count values output from each of the up/down ripple counters in response to a third control signal and a fourth control signal output from the controller.

According to an example embodiment, the image sensor may include a reference signal generator generating a ramp signal or DC signal as a reference signal.

Another example embodiment provides a method of operating an up/down ripple counter. The method may include providing a first control signal and a second control signal; performing one of a stop operation and a count operation in response to an operation control signal, the operation control signal being based at least in part on the first control signal; and performing the count operation as one of an up-count operation and a down-count operation based on the second control signal.

According to an example embodiment, the method may further include comparing a reference signal and an image signal output from a pixel; outputting a comparison signal; and generating the operation control signal by performing an OR operation of the comparison signal and the first control signal.

Still another example embodiment provides a method of operating an image sensor including a plurality of up/down ripple counters. The method may include providing a first control signal and a second control signal to the plurality of up/down ripple counters; providing each of the plurality of up/down ripple counters with a corresponding operation control signal, the operation control signal being based at least in part on the first control signal; causing each of the plurality of up/down ripple counters to perform one of a stop operation and a count operation in response to the corresponding operation control signal; and controlling the count operation to be one of an up-count operation and a down-count operation in response to the provided second control signal.

According to an example embodiment, the method may include providing a third control signal and a fourth control signal to a plurality of memory chains; outputting count values of the up/down ripple counters to the plurality of memory chains; and controlling the receiving and shifting of the count values within the plurality of memory chains based on the third control signal and the fourth control signal.

Another example embodiment provides an analog-to-digital converter (ADC) block of an image sensor. The ADC block may include a plurality of analog-to-digital converters. Each the analog-to-digital converters may receive an image signal, a reference signal, and a plurality of control signals. Further, each of the analog-to-digital converters may include a comparison circuit comparing the reference signal to the image signal, a logic gate receiving a comparison signal from the comparison circuit and the first control signal and generating an operation control signal based on the comparison signal and the first control signal, an up/down ripple counter receiving the operation control signal and the second control signal, stopping operation if the operation control signal is a first level, performing a down counting operation if the operation control signal is a second level and the second control signal is a first level, performing an up counting operation if the operation control signal is a second level and the second control signal is a second level, and a memory device receiving count values from the up/down ripple counter, the third control signal and the fourth control signal and outputting the count values based on the third control signal and the fourth control signal.

According to an example embodiment, the memory devices of the plurality of analog-to-digital converters of the ADC block are serially connected to form a plurality of memory chains. The receiving and shifting of count values within each of the memory chains is controlled in response to the third and fourth control signals. A number of memory chains corresponds to a number of bits of the up/down ripple counters.

BRIEF DESCRIPTION OF THE DRAWINGS

The above and other features and advantages of example embodiments will become more apparent in light of the following disclosure referencing the attached drawings in which.

DETAILED DESCRIPTION OF EXAMPLE EMBODIMENTS

Figure 1:
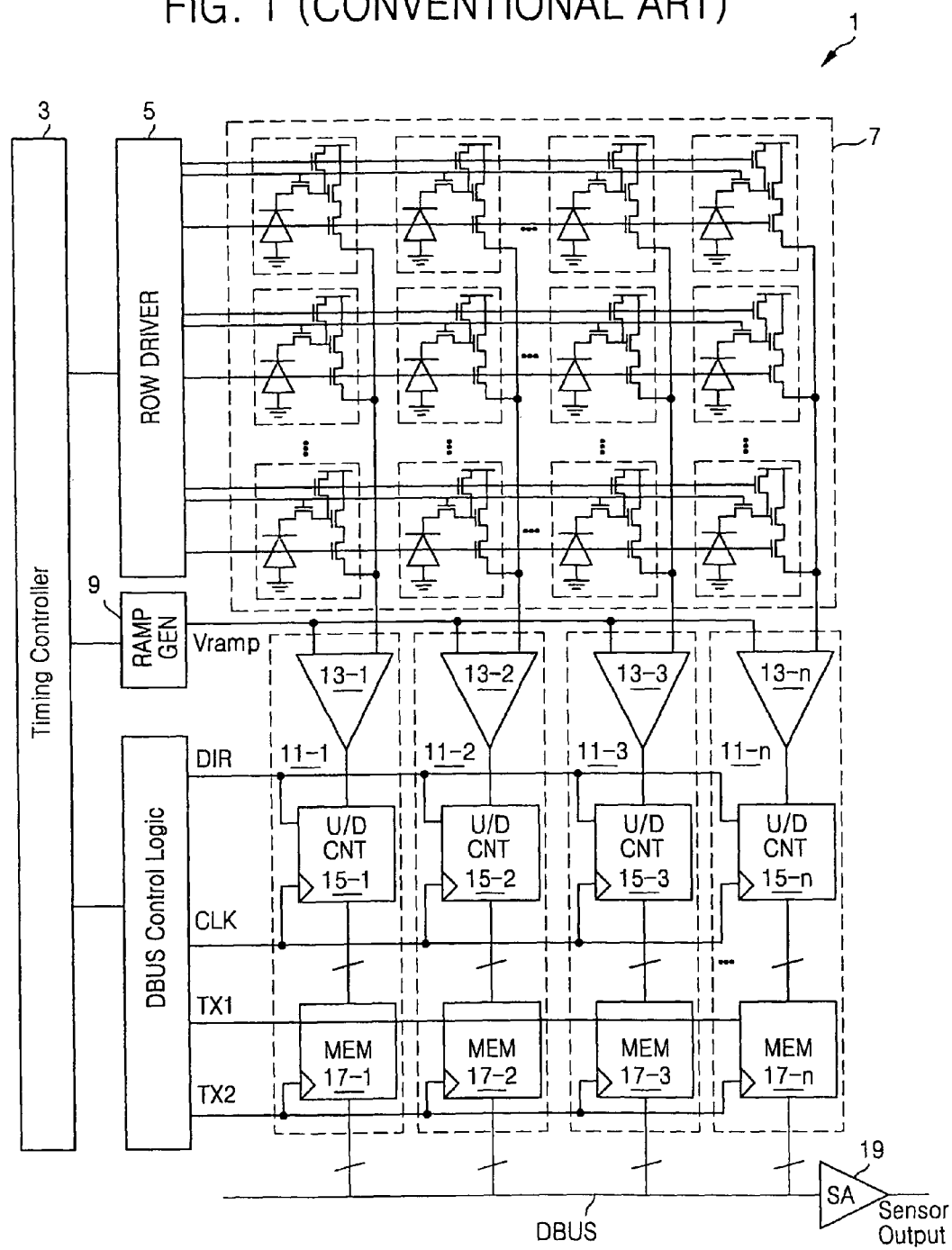
FIG. 1 is a block diagram of a conventional CMOS image sensor.

Example embodiments will now be described more fully hereinafter with reference to the accompanying drawings. Embodiments may, however, be in many different forms and should not be construed as being limited to the example embodiments set forth herein. Rather, example embodiments are provided so that this disclosure will be thorough and complete, and will fully convey the scope of this disclosure to those skilled in the art.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, and/or sections, these elements, components, regions, and/or sections should not be limited by these terms. These terms are only used to distinguish one element, component, region or section from another element, component, region or section. Thus, a first element, component, region or section discussed below could be termed a second element, component, region or section without departing from the teachings of the example embodiments.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The attached drawings for illustrating example embodiments are referred to in order to gain a sufficient understanding of this disclosure, the merits of example embodiments disclosed, and the objectives accomplished by example embodiments of this disclosure. A detailed description of example embodiments that references the drawings is provided below. It is noted that like reference numerals in the drawings denote like elements.

Figure 2:
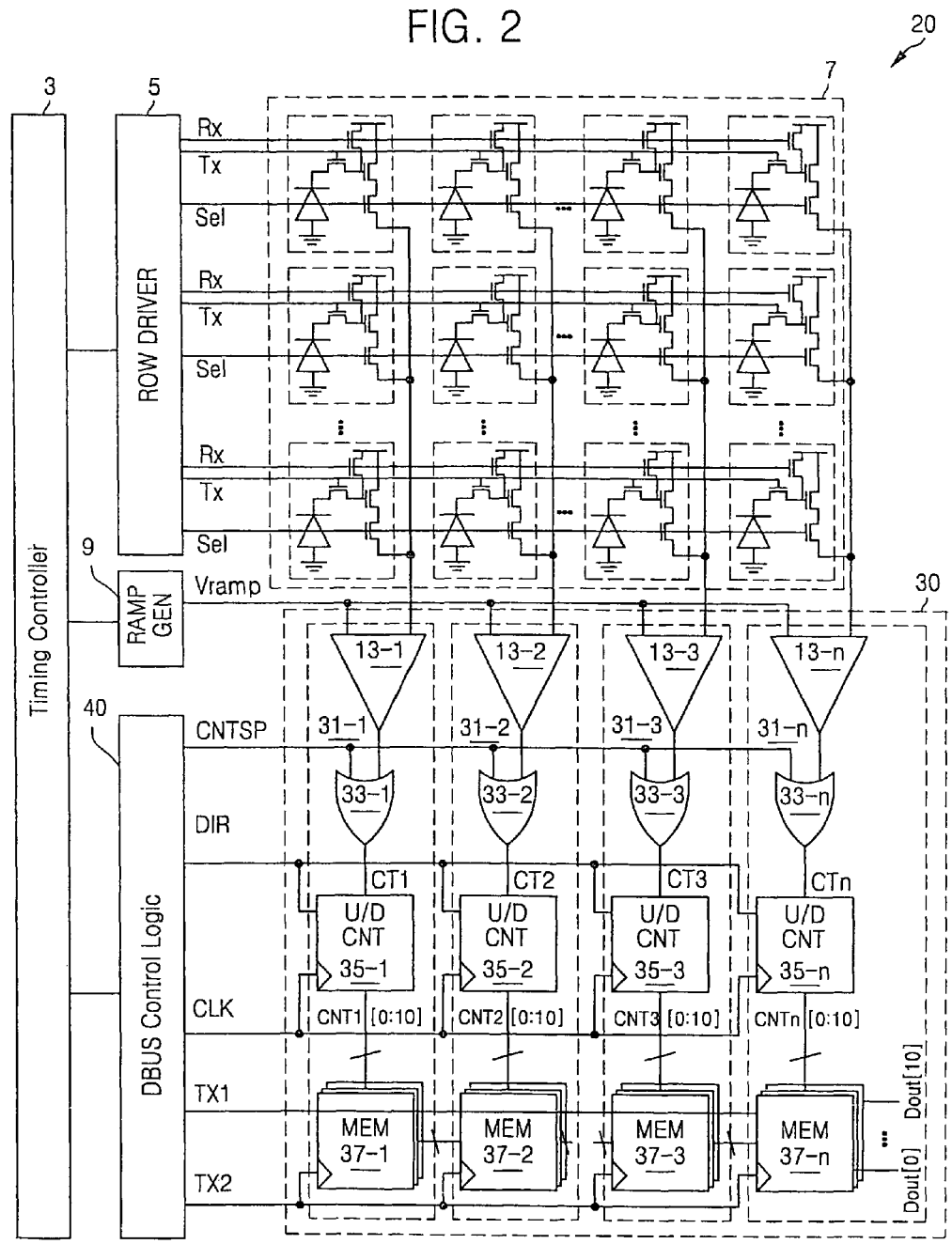
FIG. 2 is a block diagram of an example embodiment of a CMOS image sensor.

FIG. 2 is a block diagram of an example embodiment of a CMOS image sensor 20. Referring to FIG. 2 the CMOS image sensor 20 includes a timing controller 3, a row driver 5, an active pixel sensor (APS) array 7, a reference signal generator 9, a controller (or control logic) 40, and an ADC block 30.

The timing controller 3 generates a plurality of control signals to control the operations of the row driver 5, the reference signal generator 9, and the controller 40. The row driver 5 generates a plurality of control signals RX, TX, and Sel to control the operations of pixels embodied in the APS array 7 based on an address signal output from the timing controller 3. Each pixel embodied in the APS array 7 outputs pixels signals to each column. Example pixel signals include a reset signal and an image signal. The pixel signals may be based on the control signals RX, TX, and Sel.

The reference signal generator 9 may generate a ramp signal Vramp or a DC signal. The Vramp signal or DC signal may be a reference signal based on a control signal output from the timing controller 3.

The controller 40 generates a plurality of control signals CNTSP, DIR, CLK, TX1, and TX2 to control the ADC block 30 based on the control signal output from the timing controller 3. The control signals include a first control signal CNTSP and a second control signal DIR to control the operations of a plurality of up/down ripple counters 35-1, 35-2, 35-3, . . . , 35-n, where "n" is a natural number. The up/down ripple counters along with other components described below are embodied in the ADC block 30. A third control signal TX1 and a fourth control signal TX2 control the operation of each memory chain in the ADC block 30. The controller also provides a clock signal to the ADC block 30.

The ADC block 30 includes a plurality of unit ADCs 31-1, 31-2, 31-3, . . . , 31-n, where "n" is a natural number. Each of the unit ADCs 31-1, 31-2, 31-3, . . . , 31-n may convert an analog pixel signal output from a column of the APS array 7 to a digital signal. As shown in FIG. 2, each of the unit ADCs 31-1, 31-2, 31-3, . . . , 31-n respectively includes one of the comparators 13-1, 13-2, 13-3, . . . , 13-n, one of a plurality of OR circuits 33-1, 33-2, 33-3, . . . , 33-n, one of the up/down ripple counters 35-1, 35-2, 35-3, . . . , 35-n, and one of a plurality of memory devices 37-1, 37-2, 37-3, . . . , 37-n.

Each of the comparators 13-1, 13-2, 13-3, . . . , 13-n receives a pixel signal output through a column of the APS array 7 and a reference signal Vramp output from the reference voltage generator 9. Each of the comparators 13-1, 13-2, 13-3, . . . , 13-n compares the received pixel signal and reference signal Vramp, and outputs a result of the comparison. For example, if the voltage level of the reference signal Vramp is higher than that of the received pixel signal, the comparator 13-1 outputs a signal having a first level, for example, a low level or data "0". Also, if the voltage level of the reference signal Vramp is lower than that of the pixel signal, the comparator 13-1 outputs a signal having a second level, for example, a high level or data "1". However, the result may be opposite according to the polarities of input terminals.

Each of the OR circuits 33-1, 33-2. 33-3, . . . , 33-n respectively outputs one of a plurality of operation control signals CT1, CT2, CT3, CTn in response to the first control signal CNTSP output from the controller 40 and a comparison signal output from a corresponding one of the comparators 13-1, 13-2, 13-3, . . . , 13-n. For example, when any one of the first control signal CNTSP and the output signal of the comparator 13-1 has a second level, for example, a high level, the OR circuit 33-1 outputs the operation control signal CT1 having the second level, for example, the high level. According to this example, a corresponding up/down ripple counter 35-1 performs a stop operation, which is discussed in greater detail below.

Each of the up/down ripple counters 35-1, 35-2, 35-3, . . . , 35-n performs a stop operation or a count operation in response to a corresponding one of the operation control signals CT1, CT2, CT3, . . . , CTn. For example, each of the up/down ripple counters 35-1, 35-2, 35-3, . . . , 35-n performs a count operation in response to a corresponding one of the operation control signals CT1, CT2, CT3, . . . , CTn having a first level and a stop operation in response to the corresponding one of the operation control signals CT1, CT2, CT3, . . . , CTn having a second level. For example, the first level may be a low level and the second level may be a low level, or vice versa.

Also, each of the up/down ripple counters 35-1, 35-2, 35-3, . . . , 35-n performs a down-count operation or an up-count operation in response to the second control signal DIR output from the controller 40. For example, each of the up/down ripple counters 35-1, 35-2, 35-3, . . . , 35-n performs a down-count operation in response to the second control signal DIR having the first level and an up-count operation in response to the second control signal DIR having the second level, or vice versa.

Each of the memory devices 37-1, 37-2, 37-3, . . . , 37-n receives and stores an LSB (CNT1[0], CNT2[0], CNT3[0], . . . , CNTn[0]) of the count values output from a corresponding one of the up/down ripple counters 35-1, 35-2, 35-3, . . . , 35-n in response to the third and fourth control signals TX1 and TX2. Further, each of the memory devices 37-1, 37-2, 37-3, . . . , 37-n sequentially shifts the stored LSB and externally outputs the shifted LSB in response to the third and fourth control signals TX1 and TX2. As previously mentioned, the third and fourth control signals TX1 and TX2 may be provided to the memory devices by the controller 40.

A memory chain includes n-number of the memory devices 37-1, 37-2, 37-3, . . . , 37-n which are serially connected to one another. Thus, when each of the up/down ripple counters 35-1, 35-2, 35-3, . . . , 35-n is an 11-bit up/down counter, the number of the memory chain is 11. Since the memory devices 37-1, 37-2, 37-3, . . . , 37-n are serially connected to one another, a memory chain may receive the LSB (CNT1[0], CNT2[0], CNT3[0], . . . , CNTn[0]) output from the up/down ripple counters 35-1, 35-2, 35-3, . . . , 35-n, sequentially shift the received LSB, and output the shifted LSB in response to the third and fourth control signals TX1 and TX2.

Another memory chain receives a particular bit (CNT1[1], CNT2[1], CNT3[1], . . . , CNTn[1]) output from the up/down ripple counters 35-1, 35-2, 35-3, . . . , 35-n and sequentially shifts the received particular bit (CNT1[1], CTN2[1], CNT3[1], . . . , CNTn[1]) in response to the third and fourth control signals TX1 and TX2. Also, yet another memory chain receives an MSB (CNT1[10], CNT2[10], CNT3[10], . . . , CNTn[10]) output from the up/down ripple counters 35-1, 35-2, 35-3, . . . , 35-n and sequentially shifts the received MSB (CNT1[10], CNT2[10], CNT3[10], . . . , CNTn[10]) in response to the third and fourth control signals TX1 and TX2.

That is, each memory chain shifts the count values CNTn[0:10] (n=1, 2, . . . ) output from the up/down ripple counters 35-1, 35-2, 35-3, . . . , 35-n in response to the third and fourth control signals TX1 and TX2. Each memory chain serially outputs a particular digit of the count values.

Figure 3:
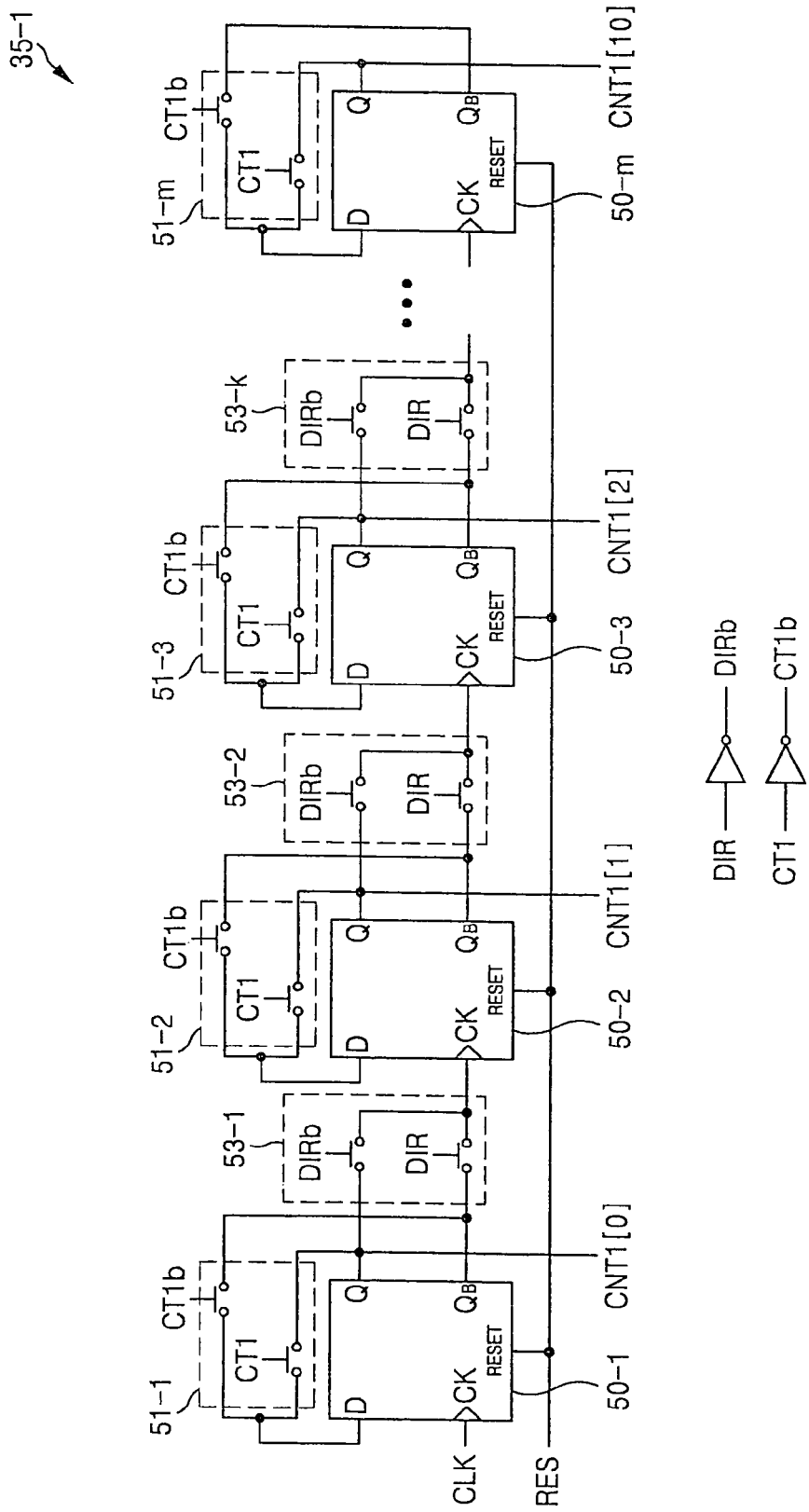
FIG. 3 is a circuit diagram of an example embodiment of a ripple counter.

FIG. 3 is a circuit diagram of an example embodiment of an up/down ripple counter. Since the structure and operation of each of the up/down ripple counters 35-1, 35-2, 35-3, . . . , 35-n are the same, the following description will focus on the structure and operation of a first up/down ripple counter 35-1. Referring to FIGS. 2 and 3, the up/down ripple counter 35-1 includes a plurality of latches 50-1, 50-2, 50-3, . . . , 50-m, where "m" is a natural number and a plurality of switch circuits. For example, the up/down ripple counter 35-1 may include 11 latches. The switch circuits include a plurality of first switches 51-1, 51-2, 51-3, . . . , 51-m and a plurality of second switches 53-1, 53-2, 53-3, . . . , 53-k, where "k" is a natural number and k<m. The switch circuits constitute a switch block.

Each of the latches 50-1, 50-2, 50-3, . . . , 50-m receives and latches an output signal of a first output terminal Q or an output signal of a second output terminal QB based on the operation of a corresponding one of the first switches 51-1, 51-2, 51-3, . . . , 51-*m* and a clock signal CLK. Each of the first switches 51-1, 51-2, 51-3, . . . , 51-*m* feedbacks an output signal or an inverted output signal of a corresponding one of the latches 50-1, 50-2, 50-3, . . . , 50-*m*, as an input signal of the corresponding one of the latches 50-1, 50-2, 50-3, . . . , 50-*m*, in response to an operation control signal CT1 or CT1*b*.

For example, when the operation control signal CT1 has a first level, each of the first switches 51-1, 51-2, 51-3, . . . , 51-*m* connects the second output terminal QB and an input terminal D of a corresponding latch 50-1, 50-2, 50-3, . . . , 50-*m*. When the operation control signal CT1 has a second level, each of the first switches 51-1, 51-2, 51-3, . . . , 51-*m* connects the first output terminal Q and the input terminal D of the corresponding latch 50-1, 50-2, 50-3, . . . , 50-*m*.

Thus, the up/down ripple counter 35-1 performs a count operation in response to the operation control signal CT1 having a first level and a stop operation in response to the operation control signal CT1 having a second level. The stop operation may be a data hold operation, for example. Each of the second switch circuits 53-1, 53-2, . . . , 53-*k* connects the first output terminal Q or the second output terminal QB of a corresponding one of the latches 50-1, 50-2, 50-3, . . . , 50-*m* and a clock terminal CK of a next latch of the serially connected latches 50-1, 50-2, 50-3, . . . , 50-*m*, in response to the second control signal DIR.

For example, the second switch circuit 53-1 connects the first output terminal Q of the latch 50-1 and the clock terminal CK of the latch 50-2 in response to the second control signal DIR having a first level, and connects the second output terminal QB of the latch 50-1 and the clock terminal CK of the latch 50-2 in response to the second control signal DIR having a second level. Similarly, the second switch circuit 53-2 connects the first output terminal Q of the latch 50-2 and the clock terminal CK of the latch 50-3 in response to the second control signal DIR having a first level, and connects the second output terminal QB of the latch 50-2 and the clock terminal CK of the latch 50-3 in response to the second control signal DIR having a second level. Thus, the up/down ripple counter 35-1 performs a down-count operation in response to the second control signal DIR having a first level and an up-count operation in response to the second control signal DIR having a second level.

Figure 4:
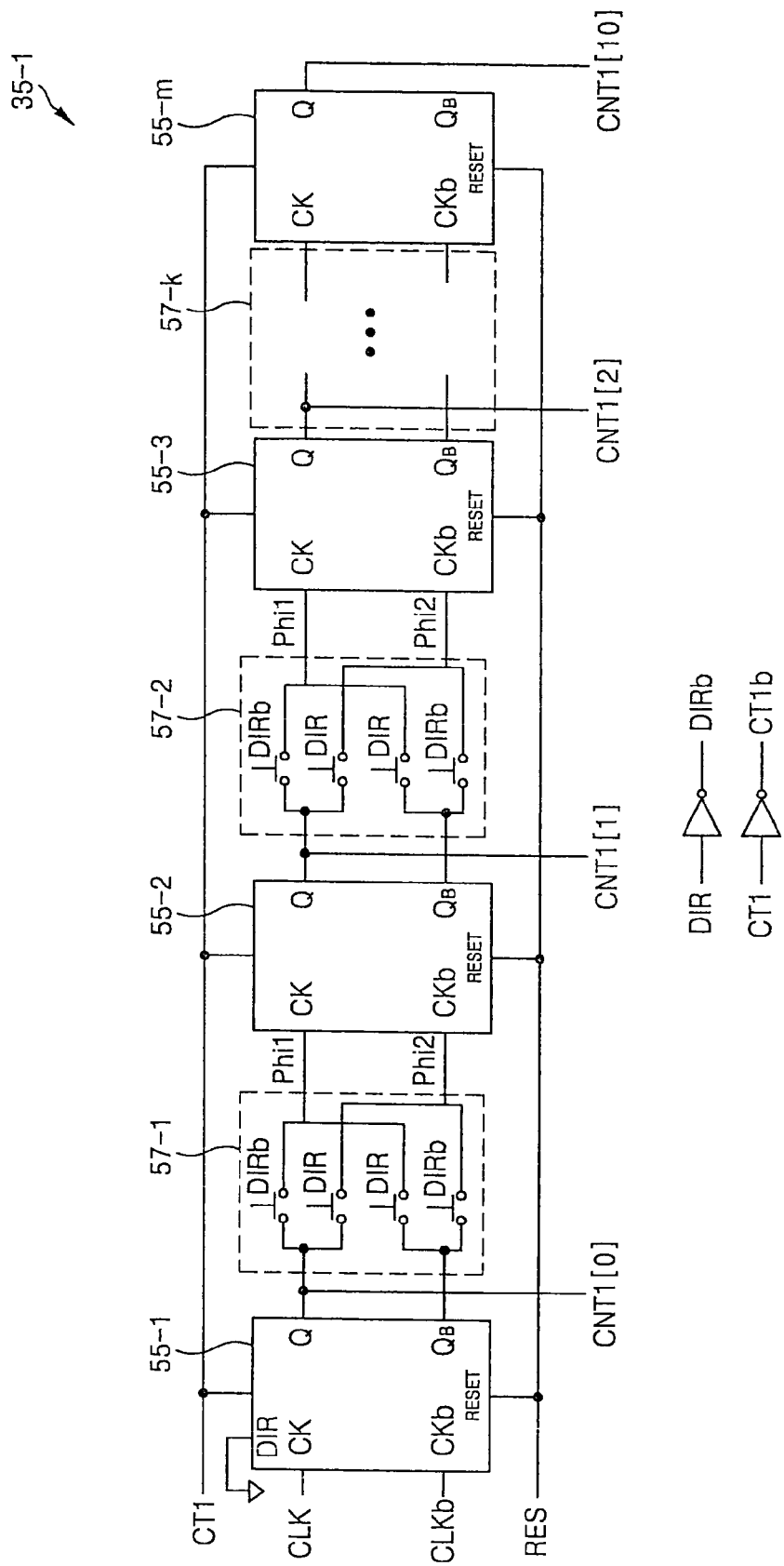
FIG. 4 is a circuit diagram of another example embodiment of a ripple counter.
Figure 5:
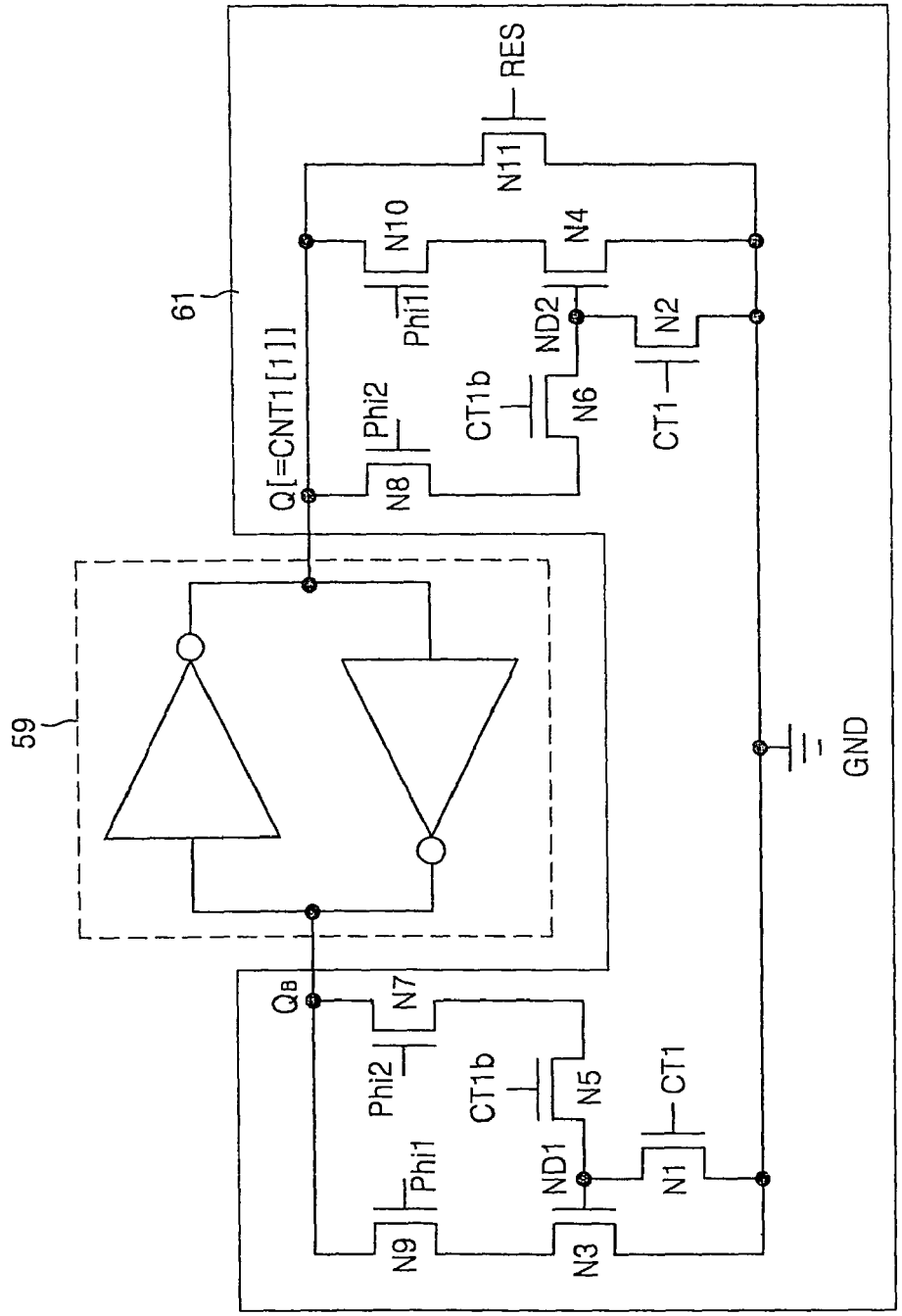
FIG. 5 is a circuit diagram of a latch of the ripple counter of FIG. 4.

FIG. 4 is a circuit diagram of a ripple counter according to another example embodiment. FIG. 5 is a circuit diagram of a latch constituting the ripple counter of FIG. 4. The up/down ripple counter 35-1 shown in FIG. 4 is embodied by a plurality of SR flip-flops 55-1, 55-2, 55-3, . . . , 55-*m*. Referring to FIGS. 4 and 5, the up/down ripple counter 35-1 includes a plurality of latches 55-1, 55-2, 55-3, . . . , 55-*m* and a switch block. The switch block includes a plurality of switch circuits 57-1, 57-2, . . . , 57-*k*.

Each of the latches 55-1, 55-2, 55-3, . . . , 55-*m* may perform a count operation or a stop operation based on the operation control signal CT1 and a down-count operation or an up-count operation based on the second control signal DIR. For example, the switch block, in response to the second control signal DIR having a first level connects the output terminals Q and QB of the first latch 55-1 and the input terminals CK and CKb of the second latch 55-2, respectively. Similarly, the switch block, in response to the second control signal DIR having the first level connects the output terminals Q and QB of the second latch 55-2 and the input terminals CK and CKb of the third latch 55-3, respectively. The first level may be a low level.

Also, the switch block, in response to the second control signal DIR having a second level cross-connects the output terminals Q and QB of the first latch 55-1 and the input terminals CK and CKb of the second latch 55-2. Stated differently, the switch block, in response to the second control signal DIR having the second level connects the output terminals Q and QB of the first latch 55-1 and the input terminals CKb and CK of the second latch 55-2, respectively. Further, the switch block, in response to the second control signal DIR having a second level cross-connects the output terminals Q and QB of the second latch 55-2 and the input terminals CK and CKb of the third latch 55-2. The second level may be a high level, for example.

As more specific examples, the first switch circuit 57-1 respectfully connects the output terminals Q and QB of the first latch 55-1 and the input terminals CK and CKb of the second latch 55-2 in response to the second control signal DIR having a first level. The second switch circuit 57-2 respectfully connects the output terminals Q and QB of the second latch 55-2 and the input terminals CK and CKb of the third latch 55-3 in response to the second control signal DIR having a first level. In this more specific example, the up/down ripple counter 35-1 performs a down-count operation.

Also, the first switch circuit 57-1 respectively connects the output terminals Q and QB of the first latch 55-1 and the input terminals CKb and CK of the second latch 55-2 in response to the second control signal DIR having a second level. The second switch circuit 57-2 respectively connects the output terminals Q and QB of the second latch 55-2 and the input terminals CKb and CK of the third latch 55-3 in response to the second control signal DIR having a second level. In this more specific example, the up/down ripple counter 35-1 performs an up-count operation.

Since the structure and operation of each of the latches 55-1, 55-2, 55-3, . . . , 55-*m* are the same, the following description will focus on the structure and operation of the second latch 55-2 as an example with reference to FIGS. 4 and 5. The latch 55-2 includes an edge triggered latch 59, which may be embodied by using two inverters serially connected to each other and a level control circuit 61, which may be embodied by a plurality of NMOSFETs N1-N11. The level control circuit 61 may control the voltage level of each of the output terminals Q and QB of the edge triggered latch 59. For example, the level control circuit 61 controls the voltage level of the output terminals Q and QB of the edge triggered latch 59 based on the operation control signal CT1, the complementary operation control signal CT1*b*, and the voltage level of each of signals Phi1 and Phi2 input through the output terminals Q and QB of the preceding latch 55-1.

If the first and second NMOSFETs N1 and N2 are turned on in response to the operation control signal CT1 having a second level, the voltage of each of the first and second nodes ND1 and ND2 becomes a ground voltage as shown by the example circuit diagram of FIG. 5. Further, if each of the third and fourth NMOSFETs N3 and N4 are turned off in response to the voltage of each of the first and second nodes ND1 and ND2, each of the output terminals Q and QB of the edge triggered latch 59 holds data that is previously latched.

However, if the operation control signal CT1 is a first level, the first and second NMOSFETs N1 and N2 may be turned off in response to the operation control signal CT1 having the first level and the fifth and sixth NMOSFETs N5 and N6 may be turned on in response to the complementary operation control signal CT1*b* having a second level.

The edge triggered latch 59 may maintain the previously latched data when the first level control signal Phi1 is in the first level and may invert each of the previously latched data values when the first level control signal Phi1 is shifted from the first level to the second level. The up/down ripple counter 35-1 performs an up-count operation or a down-count operation based on the above example operations. For example, since the ninth and tenth NMOSFETs N9 and N10 are turned off in response to the first level control signal Phi1 having a first level, even when the seventh and eighth NMOSFETs N7 and N8 are turned on in response to the second level control signal Phi2 having a second level, the voltage level of each of the output terminals Q and QB of the edge triggered latch 59 is not changed. The edge triggered latch 59 may maintain the previously latched data as it is when the first level control signal Phi1 is in the first level. However, at the moment when the first level control signal Phi1 transitions from the first level to the second level, the ninth and tenth NMOSFETs N9 and N10 are turned on in response to the first level control signal Phi1 having a second level so that the voltage level of each of the output terminals Q and QB of the edge triggered latch 59 is toggled.

For example, when the voltage level of the output terminal Q of the edge triggered latch 59 is in a high level, since each of the NMOSFETS N4 and N10 is turned on at a moment when the first level control signal Phi1 transitions from the first level to the second level, the voltage level of the output terminal Q of the edge triggered latch 59 transitions from the high level to the low level and the voltage level of the complementary output terminal QB of the edge triggered latch 59 is shifted from the low level to the high level.

In contrast, when the voltage level of the complementary output terminal QB of the edge triggered latch 59 is in a high level, since each of the NMOSFETS N3 and N9 is turned on at a moment when the first level control signal Phi1 is shifted from the first level to the second level, the voltage level of the complementary output terminal QB of the edge triggered latch 59 is shifted from the high level to the low level and the voltage level of the output terminal Q of the edge triggered latch 59 is shifted from the low level to the high level.

The eleventh NMOSFET N11 is turned on in response to a reset signal RES having a second level. Thus, the voltage level of the output terminal Q of the edge triggered latch 59 becomes a ground level in this example operation.

Figure 6:
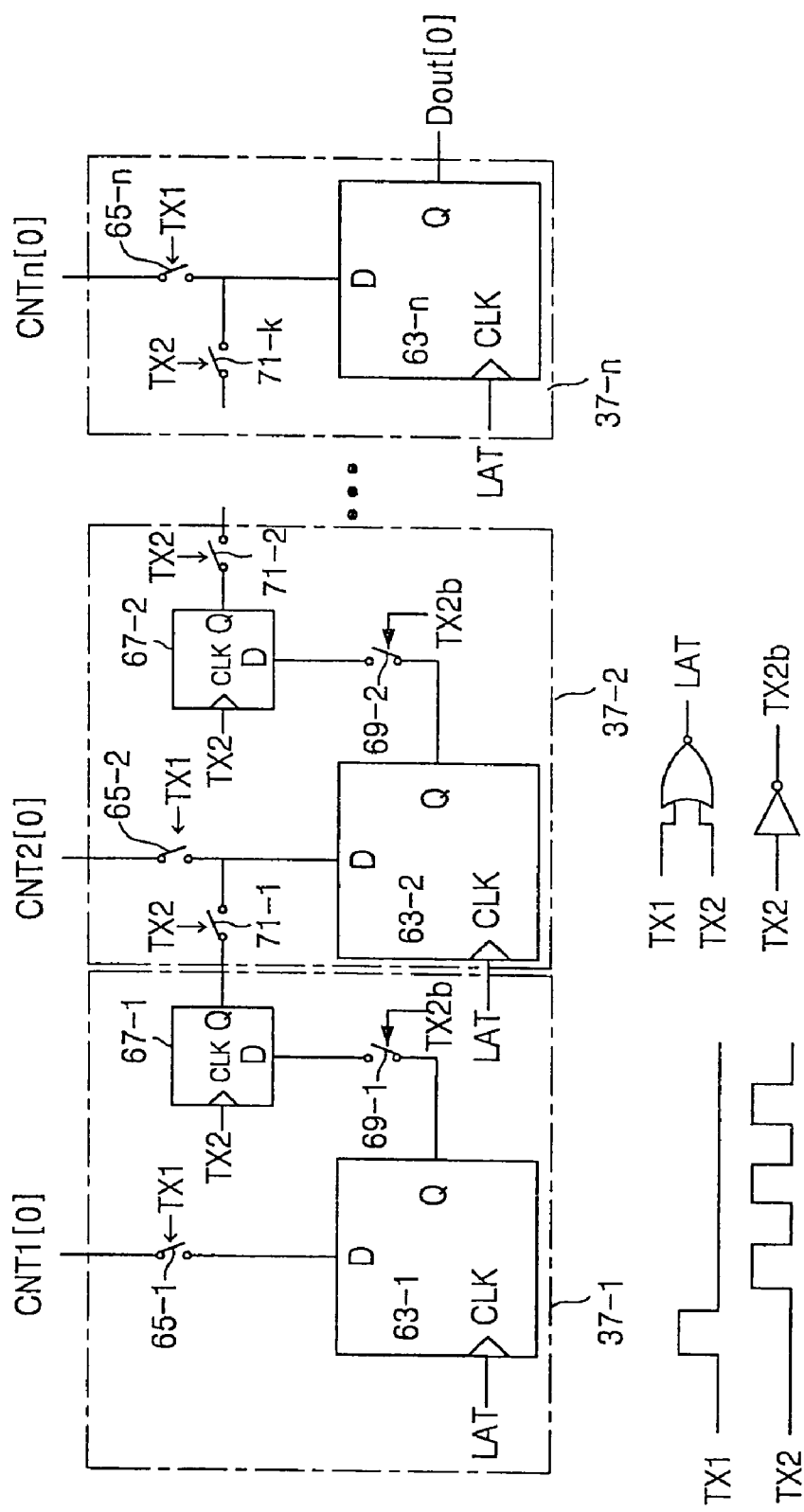
FIG. 6 is a circuit diagram of a memory chain including a plurality of memory devices according to an example embodiment.

FIG. 6 is a circuit diagram of a memory chain including a plurality of memory devices according to an example embodiment. Referring to FIG. 6, the memory chain includes a plurality of memory devices 37-1, 37-2, ..., 37-n which are connected to one another in series. The memory chain includes a plurality of first latches 63-1, 63-2, ..., 63-n, a plurality of second latches 67-1, 67-2, ..., a plurality of first switches 65-1, 65-2, ..., 65-n, a plurality of second switches 69-1, 69-2, ..., and a plurality of third switches 71-1, 71-2, ..., 71-k.

Each of the first switches 65-1, 65-2, ..., 65-n receives a respective LSB (CNT1[0], CNT2[0], CNT3[0], ..., CNTn[0]) of the count values output from the respective up/down ripple counters 35-1, 35-2, 35-3, ..., 35-n of FIG. 2. Each of the first switches 65-1, 65-2, ..., 65-n outputs the received LSB (CNT1[0], CNT2[0], CNT3[0], ..., CNTn[0]) to a corresponding one the first latches 63-1, 63-2, ..., 63-n in response to the third control signal TX1 having a second level, for example. Each of the first latches 63-1, 63-2, ..., 63-n latches the received LSB (CNT1[0], CNT2[0], CNT3[0], ..., CNTn[0]) in response to a latch signal LAT. The latch signal LAT may be generated based on a combination of the third control signal TX1 and the fourth control signal TX2. For example, the third control signal TX1 and the fourth control signal TX2 may be input to a NOR logic gate outputting the latch signal LAT as shown in FIG. 6.

The LSB (CNT1[0]) latched by the latch 63-1 passes through the latch 67-1 and is transmitted to the next latch 63-2 in response to the fourth control signal TX2 and the fourth complementary control signal TX2b. Simultaneously, the LSB (CNT2[0]) latched by the latch 63-2 passes through the latch 67-2 and is transmitted to the next latch in response to the fourth control signal TX2 and the fourth complementary control signal TX2b.

That is, after the LSB (CNT1[0], CNT2[0], ...) latched by each of the first latches 63-1, 63-2, ..., except for the last latch 63-n, is latched by each of the second latches 67-1, 67-2, ..., in response to the latch signal LAT and the fourth complementary control signal TX2b, the LSB (CNT1[0], CNT2[0], ...) latched by each of the second latches 67-1, 67-2, ..., is latched by each of the first latches 63-2, ..., 63-n, except for the first latch 63-1, in response to the fourth control signal TX2.

Each of the memory devices 37-1, 37-2, ..., 37-n which are connected in series in a memory chain method respectively latches each of the LSB (CNT1[0], CNT2[0], ..., CNTn[0]) respectively output from the up/down ripple counters 35-1, 35-2, 35-3, ..., 35-n, in response to the third control signal TX1 and the latch signal LAT. Then, each of the memory devices 37-1, 37-2, ..., 37-n sequentially shifts the LSB (CNT1[0], CNT2[0], ..., CNTn[0]) respectively latched by each of the memory devices 37-1, 37-2, 37-2, ..., 37-n to the next memory devices 37-2, 37-3, ..., 37-n, in response to the fourth control signal TX2, the fourth complementary control signal TX2b, and the latch signal LAT.

It is noted that in the general CMOS image sensor described with reference to FIG. 1, each data, that is, count values, is output through a data bus DBUS. However, in the CMOS image sensor according to an example embodiment, each count value is sequentially shifted and output in series using a corresponding one of the memory chains. Thus, the data transmission speed of the CMOS image sensor according to an example embodiment is higher than the conventional CMOS image sensor described in the background and illustrated in FIG. 1.

Figure 7:
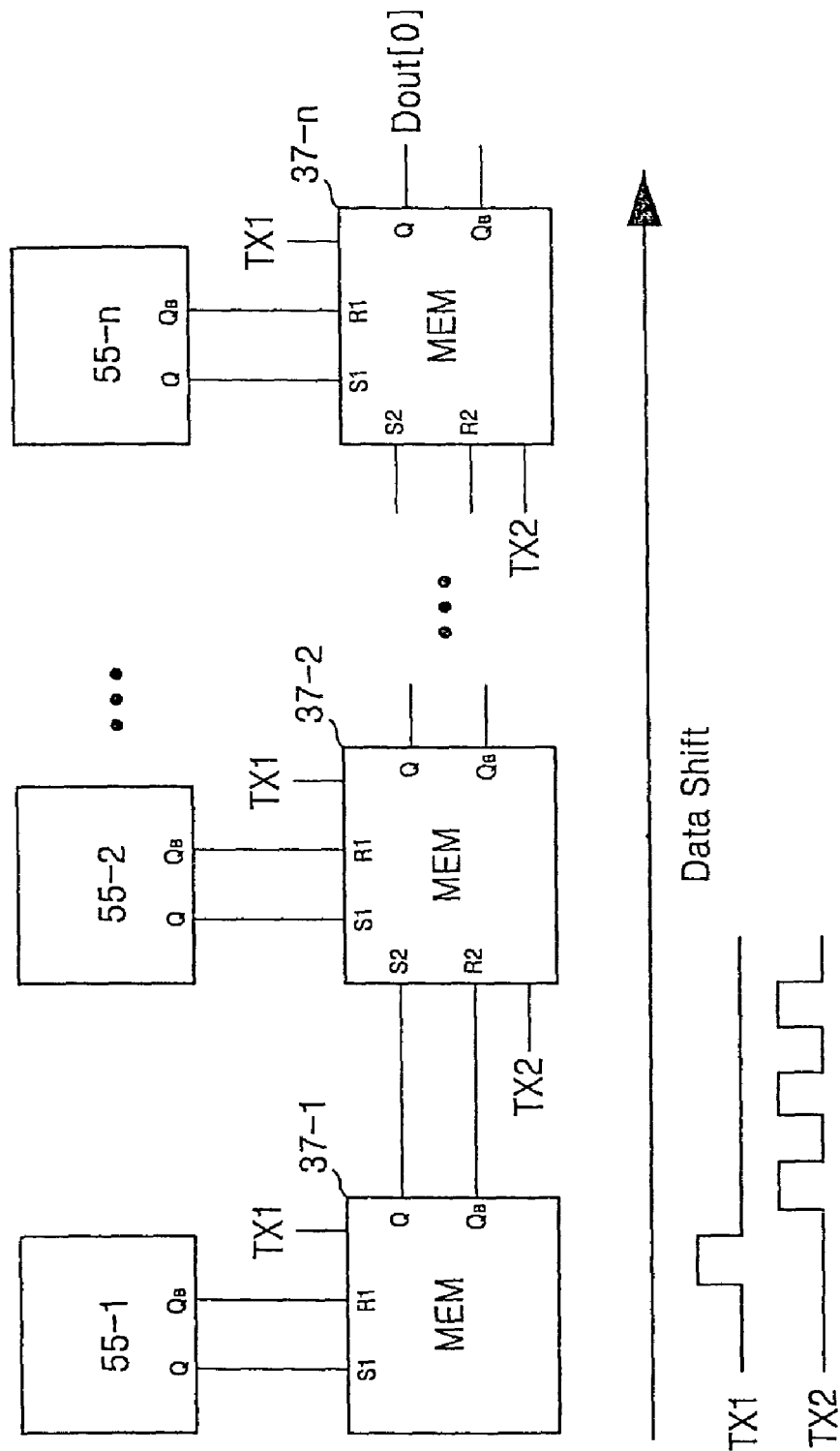
FIG. 7 is a circuit diagram of a memory chain including a plurality of memory devices according to another example embodiment.
Figure 8:
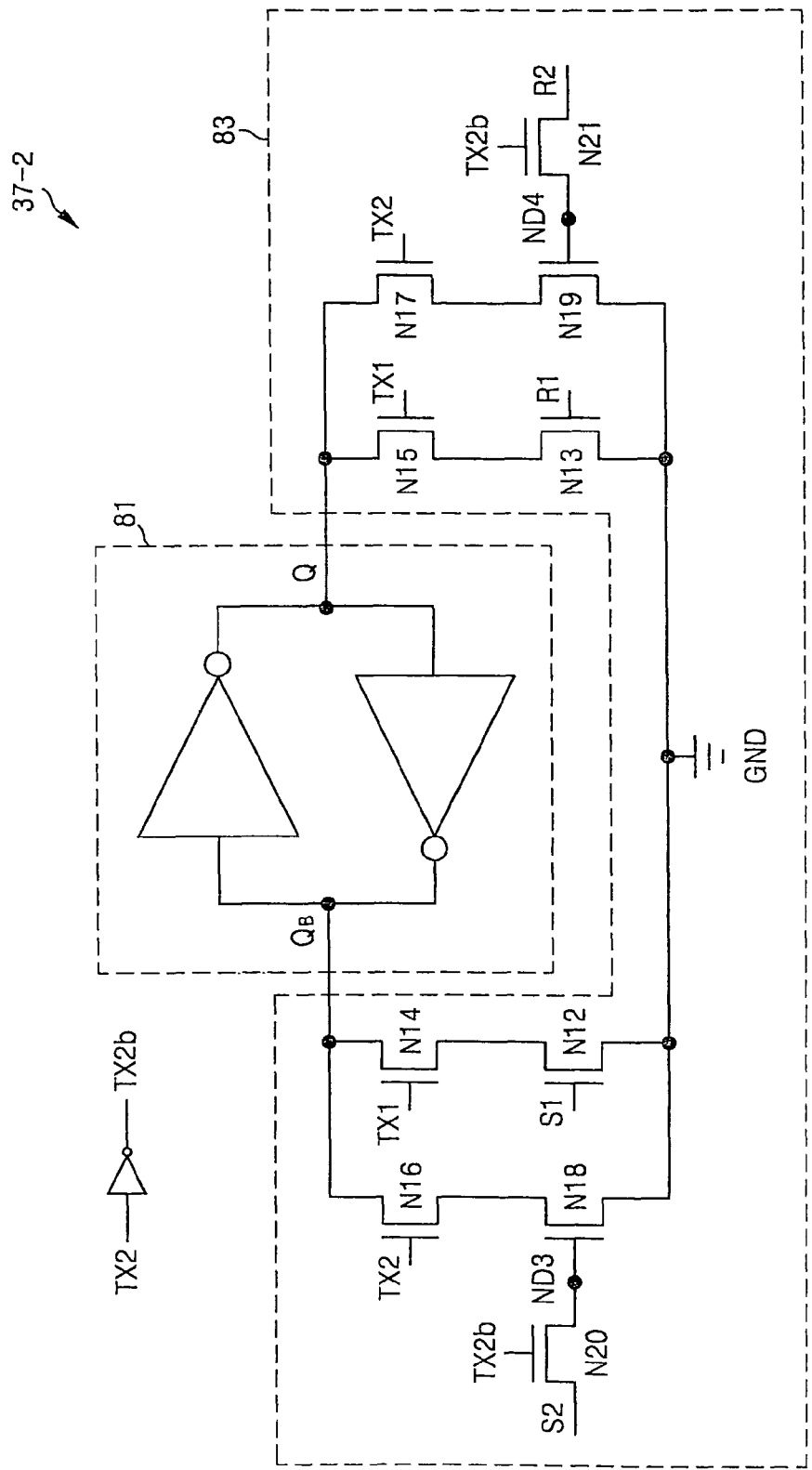
FIG. 8 is a circuit diagram of the memory device of FIG. 7.

FIG. 7 is a circuit diagram of a memory chain including a plurality of memory devices according to another example embodiment. FIG. 8 is a circuit diagram of the memory device of FIG. 7. Referring to FIGS. 7 and 8, a memory chain for processing the LSB of the count values of the up/down ripple counters 35-1, 35-2, 35-3, ..., 35-n includes the memory devices 37-1, 37-2, ..., 37-n which are connected to one another in series.

Each of the memory devices 37-1, 37-2, ..., 37-n latches each of the data Q and QB latched by a corresponding one of a plurality of latches 55-1, 55-2, 55-3, ..., 55-n in response to the third control signal TX1 and the data Q and QB latched by the corresponding one of the plurality of latches 55-1, 55-2, 55-3, ..., 55-n. The memory device 37-2 may include a level triggered latch 81 and a level control circuit 83. As shown in FIG. 8, the level triggered latch 81 includes two inverters connected to each other in series, and the level control circuit 83 includes a plurality of NMOSFETs N12-N21.

The level control circuit 83 adjusts the voltage level of each of the output terminals Q and QB of the level triggered latch 81 in response to the third control signal TX1 and the output signals output from the latches 55-1, 55-2, 55-3, ..., 55-n. For example, when the voltage level of the output terminal Q of the latch 55-2 is a high level, the voltage level of the complementary output terminal QB of the latch 55-2 is a low level, and the level of the third control signal TX1 is a high level, each of the NMOSFETs N12, N14, and N15 is turned on and the NMOSFET N13 is turned off. Thus, since the voltage level of the complementary output terminal QB of the level triggered latch 81 is a low level, the voltage level of the output terminal Q of the level triggered latch 81 becomes a high level.

Also, when the voltage level of the output terminal Q of the latch 55-2 is a low level, the voltage level of the complementary output terminal QB of the latch 55-2 is a high level, and the level of the third control signal TX1 is a high level, each of the NMOSFETs N13, N14, and N15 are turned on and the NMOSFET N12 is turned off. Thus, since the voltage level of the output terminal Q of the level triggered latch 81 is a low level, the voltage level of the complementary output terminal QB of the level triggered latch 81 becomes a high level. Each of the memory devices 37-1, 37-2, . . . , except for the last memory device 37-n, shifts a latched data to the next memory devices 37-2, . . . , 37-n in response to the fourth control signal TX2.

For example, when the voltage level of the output terminal Q of the memory device 37-1 is a high level and the voltage level of the complementary output terminal QB of the memory device 37-1 is a low level, and the voltage level of the output terminal Q of the latch 55-2 is a low level, the voltage level of the complementary output terminal QB of the latch 55-2 is a high level, the voltage level of the output terminal Q of the level triggered latch 81 is a low level and the voltage level of the complementary output terminal QB of the level triggered latch 81 is a high level.

Further, when the fourth complementary control signal TX2b has a high level, the voltage level of the node ND3 is a high level and the voltage level of the node ND4 is a low level. When the fourth control signal TX2 is changed from a low level to a high level, the voltage level of the complementary output terminal QB of the level triggered latch 81 is changed from a high level to a low level. Thus, the voltage level of the output terminal Q of the level triggered latch 81 is changed from a low level to a high level. That is, the data latched by the memory devices 37-1 is shifted to the next memory device 37-2 in response to the fourth complementary control signal TX2b and the fourth control signal TX2.

That is, each of the memory devices 37-1, 37-2, . . . , 37-n latches the data latched by a corresponding one of the latches 55-1, 55-2, 55-3, . . . , 55-n in response to the third control signal TX1 and the data latched by the corresponding one of the latches 55-1, 55-2, 55-3, . . . , 55-n. The data latched by each of the memory devices 37-1, 37-2, . . . , except for the last memory device 37-n, is shifted to a next memory device in the series of memory devices 37-2, . . . , 37-n in response to the fourth complementary control signal TX2b and the fourth control signal TX2.

In the image sensor according to the above-described example embodiments, since the SR flip-flops may be used as shown in FIGS. 4 and 8, the number of transistors can be remarkably reduced compared to that of the conventional image sensor using a master-slave D-flip-flop. Thus, the size of a chip of the image sensor may be reduced.

In the up/down ripple counter according to the above-described example embodiments and the method of operating the up/down ripple counter, the change of the output values of the up/down ripple counter during switching may be prevented. Also, the size of the image sensor according to an example embodiment may be reduced and the data transmission speed may be increased.

In the image sensor according to the above-described embodiments, since the memory chain is used, the data output from each of the up/down ripple counters is shifted through the memory chain. Since the data is output in series through the last memory device, the load of a data bus may be reduced. Thus, the data output speed of the image sensor may be improved.

While example embodiments have been particularly shown and described above, it will be understood by those skilled in the art that various changes in form and details may be made therein without departing from the spirit and scope of this disclosure.

What is claimed is:

1. An image sensor comprising:
a controller configured to generate a first control signal and a second control signal; and
a plurality of up/down ripple counters configured to receive a plurality of operation control signals, the plurality of operation control signals being based at least in part on the first control signal,
each of the plurality of up/down ripple counters configured to perform one of a stop operation and a count operation in response to a corresponding one of the operation control signals and perform the count operation as one of an up-count operation and a down-count operation based on the second control signal, and
each of the up/down ripple counters includes,
a latch having an input terminal, output terminal and complementary output terminal and clock terminal; and
a switch block configured to connect one of the output terminal and the complementary output terminal of the latch to the input terminal of the latch in response to the corresponding one of the operation control signals, connect one of an output terminal and a complementary output terminal of a preceding latch to a clock terminal of the latch in response to the second control signal, and connect one of the output terminal and the complementary output terminal of the latch to a clock terminal of a next latch in response to the second control signal.

2. The image sensor of claim 1, further comprising:
a plurality of memory chains, each of the memory chains configured to receive a count value output from each of the plurality of up/down ripple counters and shift the received count value in response to a third control signal and a fourth control signal output from the controller.

3. The image sensor of claim 2, wherein at least one memory chain includes,
a plurality of memory devices operatively connected in series.

4. The image sensor of claim 1, further comprising:
a plurality of logic gate circuits, each of the logic gates configured to generate one of the operation control signals in response to the first control signal and an image signal output from a corresponding one of a plurality of pixels.

5. The image sensor of claim 4, wherein each of the logic gate circuits is an OR gate circuit.

6. The image sensor of claim 1, further comprising:
a plurality of comparison circuits, each of the comparison circuits configured to compare a reference signal and an image signal output from a corresponding one of a plurality of pixels; and
a plurality of operation control signal generation circuits, each configured to generate and output an operation control signal in response to the first control signal and a comparison signal output from a corresponding one of the comparison circuits.

7. The image sensor of claim 6, further comprising:
a reference signal generator configured to generate one of a ramp signal and DC signal that is the reference signal.

8. The image sensor of claim 6, wherein each of the operation control signal generation circuits is an OR gate circuit.

9. An image sensor comprising:
a controller configured to generate a first control signal and a second control signal; and
a plurality of up/down ripple counters configured to receive a plurality of operation control signals, the plurality of operation control signals being based at least in part on the first control signal,
each of the plurality of up/down ripple counters configured to perform one of a stop operation and a count operation in response to a corresponding one of the operation control signals and perform the count operation as one of an up-count operation and a down-count operation based on the second control signal, wherein each of the up/down ripple counters includes,
N number of latches, wherein N>2 and N is a natural number, and
a switch block configured to feed back one of an output signal and a complementary output signal of each of the N number of latches as an input signal to each of the N number of latches in response to a corresponding one of the operation control signals, and connect one of an output terminal and a complementary output terminal of each of the N number of latches to a clock terminal of a next latch of each of the N number of latches in response to the second control signal.

10. An image sensor comprising:
a controller configured to generate a first control signal and a second control signal; and
a plurality of up/down ripple counters configured to receive a plurality of operation control signals, the plurality of operation control signals being based at least in part on the first control signal,
each of the plurality of up/down ripple counters configured to perform one of a stop operation and a count operation in response to a corresponding one of the operation control signals and perform the count operation as one of an up-count operation and a down-count operation based on the second control signal, wherein each of the up/down ripple counters includes,
a plurality of latches, and
a switch block configured to receive the second control signal and connect one of each of output terminals of a first latch and each of input terminals of a second latch and each of output terminals of the second latch and each of input terminals of a third latch based on the second control signal, and cross-connect each of the output terminals of the first latch and each of the input terminals of the second latch and each of the output terminals of the second latch and each of the input terminals of the third latch based on the second control signal.

11. The image sensor of claim 10, wherein each of the latches is an SR flip-flop.

12. The image sensor of claim 10, wherein the second latch comprises:
an edge triggered latch connected between the output terminals of the second latch; and
a level control circuit configured to control a voltage level of each of the output terminal of the second latch based on the corresponding one of the operation control signals and signals input through the input terminals of the second latch.

* * * * *